United States Patent [19]
Sako

[11] Patent Number: 6,137,183
[45] Date of Patent: Oct. 24, 2000

[54] FLIP CHIP MOUNTING METHOD AND SEMICONDUCTOR APPARATUS MANUFACTURED BY THE METHOD

[75] Inventor: Yukitoshi Sako, Chino, Japan

[73] Assignee: Seiko Epson Corporation, Tokyo, Japan

[21] Appl. No.: 09/175,781

[22] Filed: Oct. 20, 1998

[30] Foreign Application Priority Data

Oct. 24, 1997 [JP] Japan ..................................... 9-292853
Sep. 17, 1998 [JP] Japan ................................... 10-263722

[51] Int. Cl.⁷ ........................... H01L 23/48; H01L 23/52; H01L 29/40
[52] U.S. Cl. ............................................ 257/783; 257/782
[58] Field of Search ..................................... 257/782, 783, 257/778, 787; 438/108, 118, 119

[56] References Cited

U.S. PATENT DOCUMENTS 5,442,240 8/1995 Mukerji .
5,705,852 1/1998 Orihara et al. .
5,861,661 1/1999 Tang et al. .

Primary Examiner—Sheila V. Clark
Attorney, Agent, or Firm—Hogan & Hartson LLP

[57] ABSTRACT

An improved flip chip mounting method is provided for mounting an IC chip on a substrate. The IC chip has one surface and electrodes formed on the one surface, and the IC chip is positioned so that the electrodes oppose the substrate. The IC chip and the substrate are heat bonded to one another with a sheet of anisotropic conductive adhesive and paste-like adhesive being placed between the IC chip and the substrate.

22 Claims, 8 Drawing Sheets

FLIP CHIP MOUNTING METHOD AND SEMICONDUCTOR APPARATUS MANUFACTURED BY THE METHOD

BACKGROUND OF THE INVENTION

1. Field of the Invention

The present invention relates to a method of mounting an IC chip on a substrate and an apparatus manufactured by the method, and more particularly to a flip chip mounting method and a semiconductor apparatus formed thereby.

2. Description of Related Art

Figure 3:
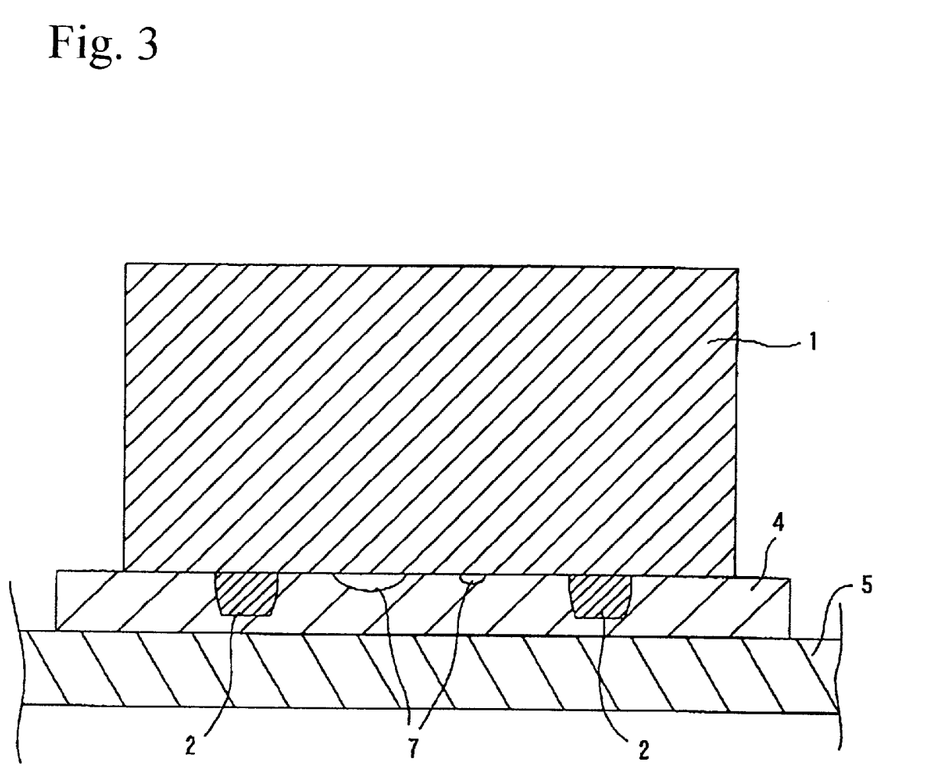
FIG. 3 schematically shows a cross-sectional view of a semiconductor apparatus that uses a film of anisotropic conductive adhesive (ACF) for bonding a flip chip on a substrate in the conventional art.
Figure 4:
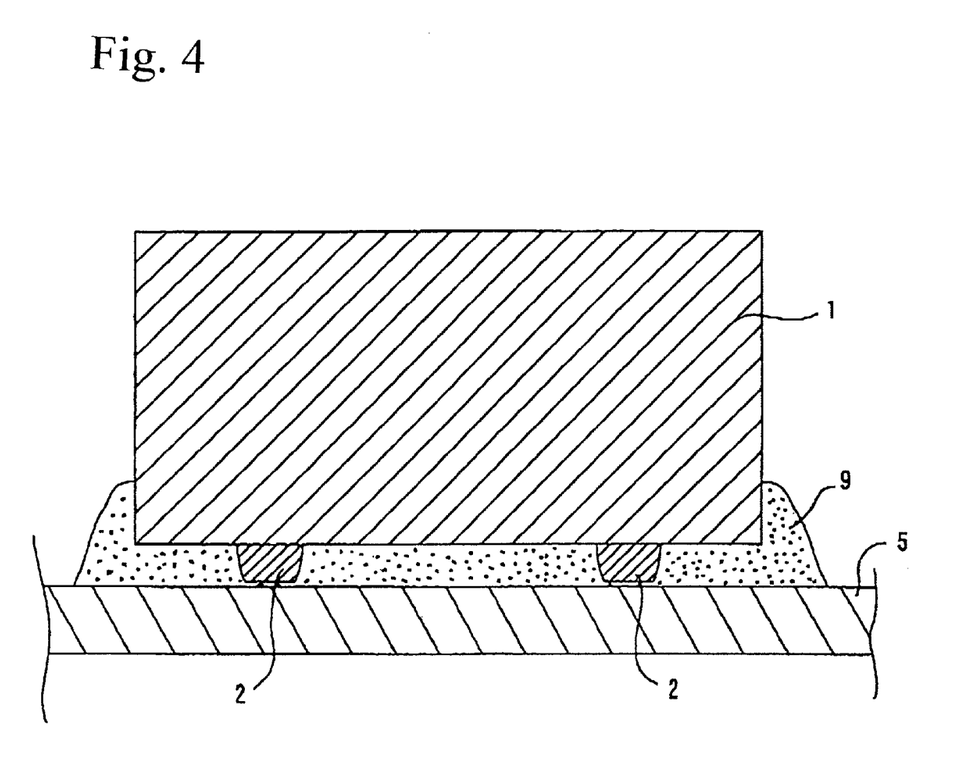
FIG. 4 schematically shows a cross-sectional view of a semiconductor apparatus that uses paste-like anisotropic conductive adhesive (ACP) for bonding a flip chip on a substrate in the conventional art.

In a typical conventional flip chip mounting method, a sheet of anisotropic conductive adhesive or a film of anisotropic conductive adhesive (herein after referred to as ACF) 4 shown in FIG. 3, or anisotropic conductive adhesive paste-like (herein after referred to as ACP) 9 shown in FIG. 4 is placed between an IC chip 1 and a substrate 5. Then, the IC chip 1 and the substrate 5 are electrically and mechanically bonded to each other by heat pressure bonding.

Figure 5:
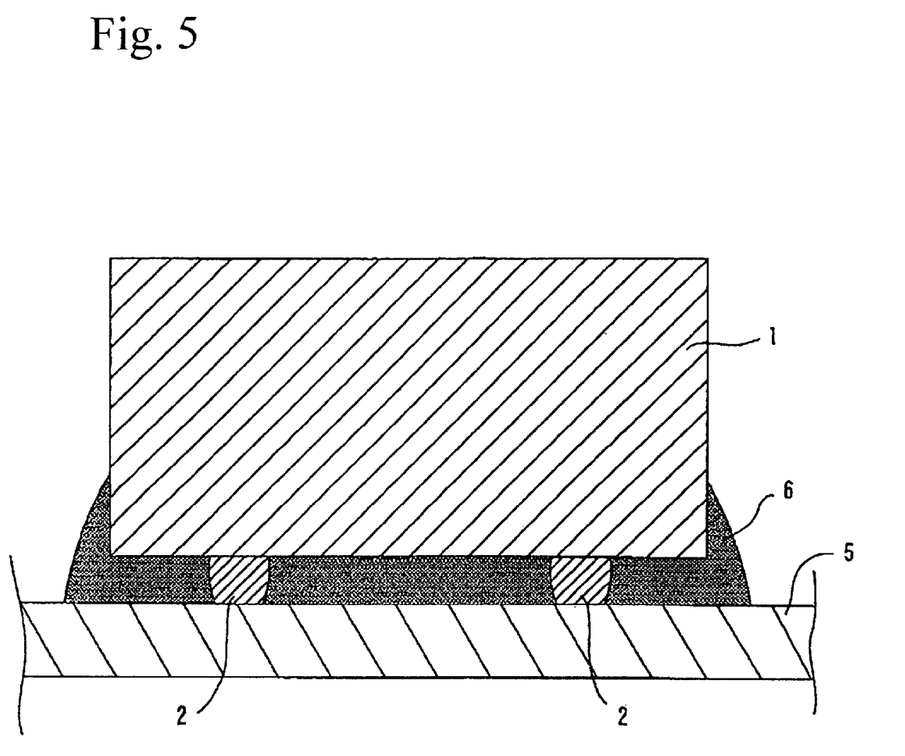
FIG. 5 shows a cross-sectional view of a semiconductor apparatus with a flip chip that uses eutectic crystallization between bumps and a metal pattern formed on a substrate surface in the conventional art.

Also, as shown in FIG. 5, a molding material 6 is used to adhere an IC chip 1 to a substrate 5. The IC chip 1 has electrode pads formed on the surface of the IC chip and bumps 2 formed on the electrode pads, and the substrate 5 has a metal pattern formed on the surface of the substrate 5. Electrical conduction between the IC chip and the substrate is obtained by using eutectic crystallization between the bumps 2 and the metal on the surface of the substrate 5. It is noted that a sheet of anisotropic conductive adhesive (ACF) is likewise called as an anisotropic conductive film or an anisotropic conductive sheet.

In the conventional technique, a sheet of anisotropic conductive adhesive (ACF) or anisotropic paste-like adhesive (ACP) is independently used, as described above. For example, poor bonding may occur because the ACF may not be sufficiently bonded in an area of the connecting surface, or bubbles 7 generated during the heat pressure bonding process may remain along the connecting surface of the IC chip, as shown in FIG. 3. Further, in the case of an ACP, electrical and mechanical bonding capability of the ACP may not be sufficient. The conventional technique therefore does not provide a high level of stable and reliable mounting method.

Also, when the metal eutectic reaction between bumps on the IC chip and metal on the substrate surface is used, good quality eutectic metal is not formed and poor bonding takes place if there is even a small defect in the finishing of the bumps or the metal surface.

SUMMARY OF THE INVENTION

It is an object of the present invention to provide a flip chip mounting method using anisotropic conductive material with a high level of bonding reliability. It is another object of the present invention to provide a semiconductor apparatus that is manufactured according to the above-described mounting method.

(1) In a flip chip mounting method in accordance with an embodiment of the present invention, an IC chip having electrodes formed on one surface of the IC chip is mounted on a substrate with the one surface of the IC chip being opposite to the substrate. In one aspect of the present embodiment, the IC chip and the substrate are bonded to one another in a state in which a sheet of anisotropic conductive adhesive and paste-like adhesive are placed between the IC chip and the substrate.

As a result, when the IC chip is bonded to the substrate, the paste-like adhesive having a high fluidity instantaneously fills gaps between the surface of the IC chip on which the electrode is formed and the ACF, and therefore bubbles are not readily generated. Further, when bumps are provided on the IC chip, there may be an occasion where the ACF cannot conform itself to changes in the surface configuration of the IC chip in an area adjacent to the bumps, bubbles may remain in the area adjacent the bumps. However, even in such an occasion, a compression force applied by a flip chip bonder expels the bubbles out of connection surfaces of the IC chip and the substrate as the paste-like adhesive flows outwardly, and do not remain between the bonding surfaces. As a result, the reliability in bonding the IC chip and the substrate is further improved.

(2) In a flip chip mounting method in accordance with another embodiment, the paste-like adhesive is composed of an anisotropic conductive adhesive. As a result, when the IC chip and the substrate are bonded together, conductive particles contained in the sheet of anisotropic conductive adhesive and conductive particles contained in the ACP are present between the electrodes and bumps on the IC chip and the bumps and patterns on the substrate. Accordingly, conductivity between the IC chip and the substrate is secured, and a required conductivity is more securely obtained than a bonding method that uses only conductive particles of a sheet of anisotropic conductive adhesive. As a result, the reliability in electrically connection between the IC chip and the substrate is improved.

(3) In a flip chip mounting method in accordance with another embodiment of the present invention, the IC chip and the substrate are bonded to one another by heat pressure bonding. In accordance with this method, when the IC chip and the substrate are heat-bonded to one another, the sheet of anisotropic conductive adhesive present between the electrodes and bumps on the IC chip and the patterns and bumps on the substrate is subjected to compression stress, and exhibits conductivity. Further, when conductive particles are also contained in the paste-like adhesive, the paste-like adhesive also exhibits conductivity. When the sheet of anisotropic conductive adhesive is subjected to compression stress, deformation thereof is promoted so that the sheet of anisotropic conductive adhesive conforms to the configuration of the surface of the IC chip on which the electrodes are formed, the fluidity of the paste-like adhesive is increased so that it flows into gaps between the ACF and the surface of the IC chip on which the electrodes are formed, and discharging of bubbles trapped between the surface of the IC chip on which the electrodes are formed and the substrate is promoted. As a result, the reliability in mechanical and electrical bonding between the IC chip and the substrate is further improved.

(4) In a flip chip mounting method in accordance with another embodiment, the sheet of anisotropic conductive adhesive is disposed on the side of the substrate and the paste-like adhesive is disposed on the side of the IC chip. As a result, when the bonding surface of the substrate is flat, the sheet of anisotropic conductive adhesive also has a flat surface. Therefore, when the sheet of anisotropic conductive adhesive is placed on the substrate, a gap is difficult to be formed between the substrate and the sheet of anisotropic adhesive, and therefore good bonding is achieved. Also, when the surface of the IC chip on which the electrodes are formed has bumps, the paste-like adhesive can be coated so that protrusions and pits of the surface are filled and covered. As a result, when the IC chip and the substrate are bonded together, air is difficult to remain between the IC chip and the substrate. As a consequence, the reliability in mechanical and electrical bonding between the IC chip and the substrate is further improved.

(5) In a flip chip mounting method in accordance with another embodiment, the sheet of anisotropic conductive adhesive is adhered to the substrate before the IC chip is heat-pressure bonded. In accordance with this method, the IC chip and the substrate can be heat-pressure bonded by a flip chip bonder immediately after placing the IC chip (in which the paste-like adhesive is coated on the surface of the IC chip on which the electrodes are formed) on the sheet of anisotropic conductive adhesive that is adhered to the patterns of the substrate, or after coating the paste-like adhesive on the anisotropic conductive adhesive and placing the IC chip thereon. Therefore, the bonding between the IC chip and the substrate is readily performed. Also, if the IC chip is correctly positioned at a designated location, high accuracy is not required in positioning and pasting the anisotropic conductive adhesive. This facilitates the positioning and pasting work. As a result, the efficiency of the process for bonding the IC chip and the substrate is improved.

(6) In a flip chip mounting method in accordance with another embodiment of the present invention, the paste-like adhesive is coated on the sheet of anisotropic conductive adhesive adhered to the substrate, before the heat-pressure bonding of the IC chip is conducted. In accordance with this method, the IC chip and the substrate can be heat-pressure bonded by a flip chip bonder without an intervening step after coating the paste-like adhesive on the sheet of anisotropic conductive adhesive that is adhered on a pattern of the substrate, and placing the IC chip thereon. As a result, the process for bonding an IC chip and a substrate becomes more effective.

(7) In a flip chip mounting method in accordance with another embodiment of the present invention, the paste-like adhesive is coated on the one surface of the IC chip before the heat-pressure bonding is conducted. In accordance with this method, by simply coating the paste-like adhesive in a specified thickness on the surface of the IC chip on which the electrodes are formed, bonding capability and strength required for the adhesive is obtained. Accordingly, control of the coating amount of the adhesive is facilitated, the amount of the paste-like adhesive to be used is reduced, and management of the process of bonding IC chips and substrates become easier.

(8) In a flip chip mounting method in accordance with an embodiment of the present invention, the sheet of anisotropic conductive adhesive is adhered to the paste-like adhesive coated on the one surface of the IC chip before the heat-pressure bonding. In accordance with this method, when the paste-like adhesive is coated on the surface of the IC chip on which the electrodes are formed, and the IC chip with the sheet of anisotropic conductive adhesive adhered thereto is placed on the paste-like adhesive, the IC and the substrate can be heat-pressure bonded by a flip chip bonder without an intervening step. As a result, the bonding between the IC chip and the substrate is readily accomplished. Also, if the IC chip is correctly positioned at a designated location, high accuracy is not required in positioning and pasting the anisotropic conductive adhesive. This facilitates the positioning and pasting work. As a result, the efficiency of the process for bonding the IC chip and the substrate is improved.

(9) In a flip chip mounting method in accordance with an embodiment of the present invention, the paste-like adhesive has a viscosity which does not cause dripping of the paste-like adhesive from the one surface of the IC chip when the one surface of the IC chip coated with the paste-like adhesive faces down. In accordance with this method, during a process of placing the IC chip on the substrate after the paste-like adhesive is coated on the surface of the IC chip on which the electrodes are formed, the paste-like adhesive is prevented from dripping onto a portion which is not required to be bonded with the IC chip. Accordingly, an accident, such as for example, accidental bonding between unrelated parts and the like is prevented.

(10) Furthermore, in a flip chip mounting in accordance with another embodiment of the present invention, before the heat-pressure bonding process, the sum of thickness of the sheet of anisotropic conductive adhesive and the paste-like adhesive is greater than the height of a bump formed on either the IC chip or the substrate. In accordance with this method, when the IC chip is heat bonded, the paste-like adhesive between the IC chip and the sheet of anisotropic conductive adhesive is squeezed out onto a peripheral edge portion of the IC chip by a pressure force applied by a flip chip bonder. The paste-like adhesive squeezed out forms a filet on a peripheral side section of the IC chip. As a result, the filet secures mechanical bonding between the IC chip and the substrate, as well as functions as molding material. Accordingly, foreign material and water are prevented from entering the bonding surfaces of the IC chip and the substrate.

(11) In a flip chip mounting method in accordance with a further embodiment, the sum of thickness of the sheet of anisotropic conductive adhesive and the paste-like adhesive is set in a range in which the height of a filet formed with the sheet of anisotropic conductive adhesive and the paste-like adhesive during the heat pressure bonding process is greater than a level of the one surface of the IC chip and smaller than another surface of the IC chip on the opposite side of the one surface of the IC chip. In accordance with this method, when the IC chip is heat bonded, the paste-like adhesive between the IC chip and the sheet of anisotropic conductive adhesive is squeezed out onto a peripheral edge portion of the IC chip by a pressure force applied by a flip chip bonder, and forms a filet on the peripheral side section of the IC chip. As a result, the paste-like adhesive is prevented from extending to a height that is the same as or higher than the height of the IC chip, and therefore is prevented from adhering to a plunger jig of the flip chip bonder and bonding the IC chip and the plunger jig. As a result, the reliability of the process of bonding IC chips and substrates is improved.

(12) Further, in a flip chip mounting method in accordance with an embodiment of the present invention, the sheet of anisotropic conductive adhesive has an area greater than that of the one surface of the IC chip. In accordance with this method, when the IC chip is heat bonded, the paste-like adhesive between the IC chip and the sheet of anisotropic conductive adhesive is squeezed out onto a peripheral edge portion of the IC chip and forms a filet on a base defined by a portion of the sheet of anisotropic conductive adhesive that is not adhered to the surface of the IC chip on which the electrodes are formed, in other words, an excess area of the sheet of anisotropic conductive adhesive that protrudes from the peripheral edge portion of the IC chip. As a result, the formation of a filet on the peripheral side portion of the IC chip is promoted, and thus the mechanical bonding between the IC chip and the substrate is more reliably obtained.

(13) In a flip chip mounting method in accordance with another embodiment of the present invention, the sheet of anisotropic conductive adhesive has an area that is set in a range in which the height of a filet formed with the sheet of anisotropic conductive adhesive and the paste-like adhesive after the heat pressure bonding process is greater than a level of the one surface of the IC chip and smaller than another surface of the IC chip on the opposite side of the one surface.

In accordance with this method, when the IC chip is heat bonded, the paste-like adhesive between the IC chip and the sheet of anisotropic conductive adhesive is squeezed out into a peripheral edge portion of the IC chip, and forms a filet on the peripheral side section of the IC chip. Furthermore, the paste-like adhesive is prevented from extending to a height that is the same as or higher than the height of the IC chip, and therefore is prevented from adhering to a plunger jig of the flip chip bonder and bonding the IC chip and the plunger jig. As a result, the reliability of the process of bonding IC chips and substrates is improved.

(14) In a flip chip mounting method in accordance with still another embodiment of the present invention, conductive particles contained in the sheet of anisotropic conductive adhesive and conductive particles contained in the paste-like adhesive have generally the same diameter.
As a result, when the IC chip is heat bonded, the conductive particles contained in the sheet of anisotropic conductive adhesive and the conductive particles contained in the paste-like adhesive coexist between the electrodes of the IC chip and the bumps or between the pattern of the substrate and the bumps, and both of the conductive particles fill spaces between the electrodes of the IC chip and the bumps or between the pattern of the substrate and the bumps to contribute to electrical connection. As a result, the reliability in electrical connection between the IC chip and the substrate is improved.

In a preferred embodiment, the diameter of the conductive particles contained in the sheet of anisotropic conductive adhesive and the paste-like adhesive is in a range of about 2~10 $\mu$m in order to secure electrical connection between the IC chip and the substrate.

(15) In a flip chip mounting method in accordance with another embodiment of the present invention, passive devices which are mounted together with the IC chip are connected to the substrate by the sheet of anisotropic conductive adhesive and the paste-like adhesive. In accordance with this method, for example in a typical solder mounting process, defects such as short circuit accompanied by the soldering mounting process can be avoided. Also, mounting steps for the IC chip and the passive devices are completed in a single step. Furthermore, a washing step to remove remained flux becomes unnecessary. As a result, the connection reliability between the passive elements and the substrate is improved, and at the same time, the efficiency of the process of mounting passive devices is improved.

(16) Furthermore, a semiconductor apparatus is manufactured by any one of the flip chip mounting methods described above. In accordance with the semiconductor apparatus thus manufactured, the electrical and mechanical connection between the IC chip and the substrate mounted in the apparatus becomes more reliable. As a result, semiconductor apparatuses are manufactured with a higher reliability.

Other features and advantages of the invention will be apparent from the following detailed description, taken in conjunction with the accompanying drawings which illustrate, by way of example, various features of embodiments of the invention.

PREFERRED EMBODIMENTS

Hereunder, embodiments of a flip chip mounting method and a semiconductor apparatus manufactured by the method will be described with reference to accompanied drawings.

Figure 1:
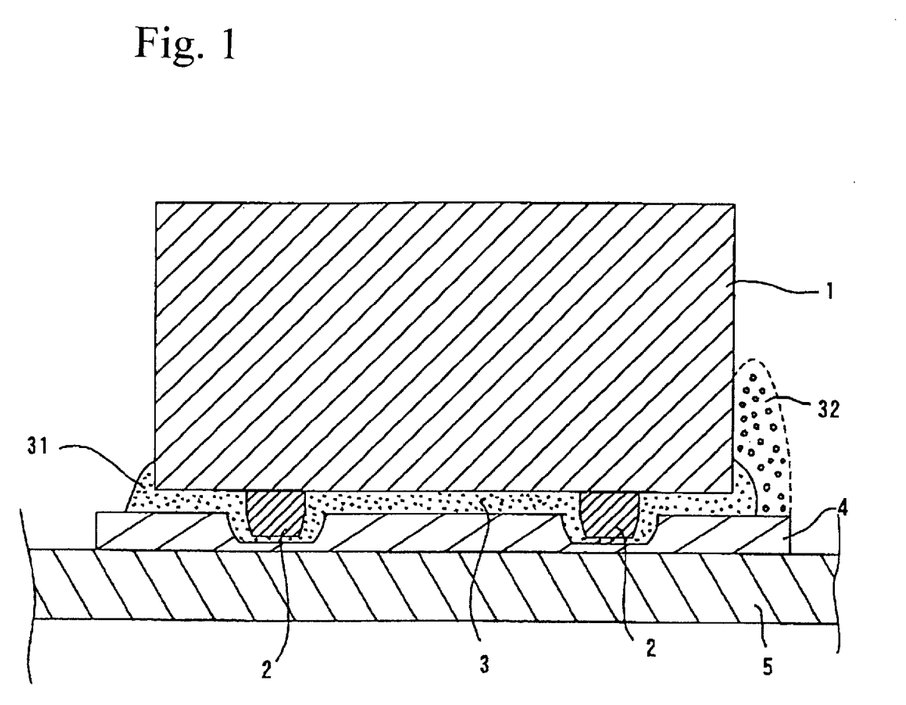
FIG. 1 schematically shows a cross-sectional view of a semiconductor apparatus having substrate and a flip chip mounted on the substrate in accordance with an embodiment of the present invention.

FIG. 1 shows an IC chip 1 having electrode pads formed on the surface of the IC chip 1. Bumps 2 are formed on the electrode pads of the IC chip 1 and are electrically and mechanically connected to a substrate 5 with paste-like adhesive 3 and an ACF 4.

More specifically, the IC chip 1 and the substrate 5 are heat-pressure bonded together with the paste-like adhesive 3 and the ACF 4 being placed between the IC chip 1 and the substrate 5, and the bumps 2 formed on the electrode pads of the IC chip 1 are electrically connected to a pattern formed on the substrate 5.

The paste-like adhesive 3 has a high fluidity, and can be coated on the surface of an object to be bonded. When a pressure force is applied to the IC chip 1 and the substrate 5 having the ACF 4 being placed therebetween, the coated paste-like adhesive 3 flows from a location where the IC chip 1 and the substrate 5 are pressed against one another with a higher pressure to a location where such pressure is relatively lower, for example, into gaps between the IC chip 1 and the ACF 4. As a result, the paste-like adhesive 3 spreads across the entire surface of the IC chip to be bonded. Therefore, after hardening of the paste-like adhesive 3, bonding of the entire surface is accomplished.

The ACF 4 is composed of an adhesive binder that provides a bonding and insulating property and conductive particles for providing electrical conductivity, and is in the solid state. Also, the ACF 4 is formed into a sheet to be used for bonding the IC chips. A variety of products having different combinations of the adhesive binder and the conductive particles are available for different purposes. In recent years, the type of adhesive binder has been changing from the thermoplastic type to the thermosetting type for higher connection reliability. In more recent years, a repairable thermosetting type adhesive binder that is composed of denatured epoxy resin is used more often, in consideration of convenience for post-connection repair (wiring repair) and rework (chip replacement).

Carbon fibers and solder particles were often used for the conductive particles before. However, in recent years, different types of particles are used for different applications. For example, metal particles are often used for patterns formed by a material that likely generates cracks on its surface, and nickel or gold plated resin particles are advantageous in connecting fine-pitched parts, and therefore are often used in bonding work for LCDs because the nickel or gold plated resin particles have elasticity and coefficient of thermal expansion similar to those of the adhesive binder, and it is easy to make the particle diameter uniform.

Figure 2:
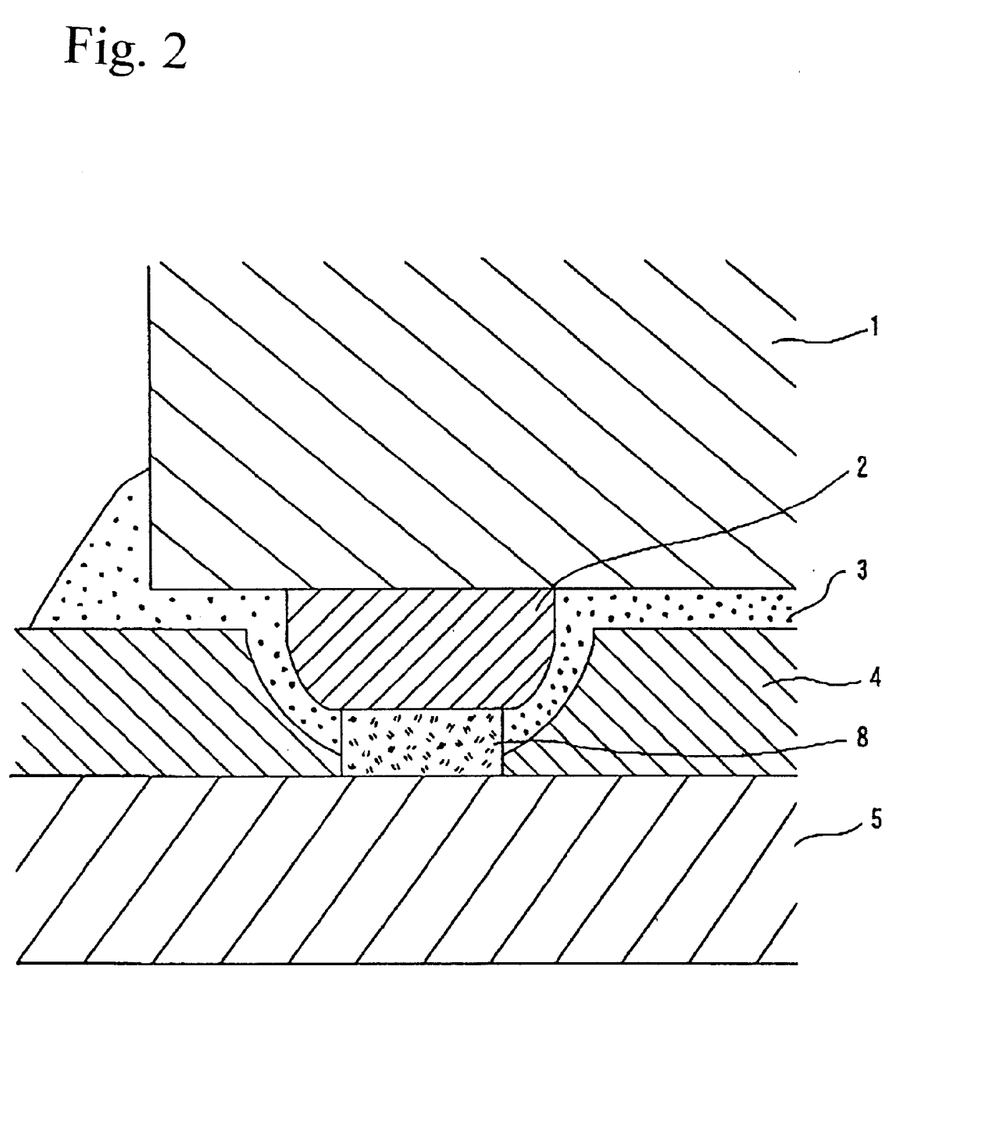
FIG. 2 schematically shows an expanded view of an area around a bump of a flip chip in the semiconductor apparatus shown in FIG. 1.

As shown in FIG. 2, the paste-like adhesive 3 and the ACF 4 are deformed by a pressure force applied by the flip chip bonder, and an area adjacent to the bumps 2 presents the largest deformation. The paste-like adhesive 3 and the ACF 4 that are present beneath the bumps 2 increase their fluidity at the time of heat bonding, and a mixed region 8 of the paste-like adhesive and ACP is formed. In the mixed region 8 of the paste-like adhesive 3 and the ACP, when the IC chip 1 is placed on the substrate 5, air bubbles may remain between the bottom surface of the bumps 2 and the paste-like adhesive 3. However, when the heat-pressure bonding is conducted, the paste-like adhesive 3 and the ACF 4 flow from the bottom surface of the bumps 2 to the respective peripheral edges of the bumps 2 as a pressure force is applied by the flip chip bonder, the bubbles also move. As a result, the bubbles do not remain under the bottom surfaces of the bumps 2 which are the most important portions in terms of electrical conductivity. Furthermore, bubbles remaining in other areas are also moved outside of the peripheral edge of the IC because of the high fluidity of the paste-like adhesive 3.

It is noted that the paste-like adhesive 3 and the ACF have a total thickness that is generally equal to the thickness of the bumps 2 and the conductor on the substrate 5, i.e., about 30~50 $\mu$m. Accordingly, a pressure force of about 50~100 g for each bump is required to generate a deformation shown in FIG. 2 to obtain electrical connection.

Also, it is generally perceived that, in order to obtain effective electrical connection, three or more conductive particles are required between the bumps 2 and the metal formed on the surface of the substrate 5.

In accordance with the embodiments described above, because the paste-like adhesive 3 is coated on a surface of the ACF 4 to which the IC chip 1 is connected, the paste-like adhesive 3 having a high degree of fluidity flows in and completely fills gaps between the ACF 4 and the surface of the IC chip 1 in compliance with a deformation caused by a pressure force applied at the time of heat-pressure bonding. When air bubbles remain in bonding surfaces between the ACF 4 and IC chip 1, the bubbles move through the paste-like adhesive 3 by the pressure force applied by the flip chip bonder, and are finally squeezed out from the bonding surfaces. Also, by the pressure force, the paste-like adhesive 3 and a portion of the ACF having a high fluidity flow out onto the peripheral area of the IC chip 1. This portion forms a filet 31 after the paste-like adhesive 3 hardens and functions as a mold material.

The bumps may be formed by any one of appropriate methods, such as, for example, a plating method in which they are formed by electrolytic plating, a transfer method in which bumps are transferred and connected on the side of inner leads, a stud stamp method using wire bonding, and the like. In accordance with the present embodiments, any one of the methods may be used to form the bumps. Typically, the bump pitch for IC chips is normally very small, for example, about 60~70 $\mu$m.

Figure 8:
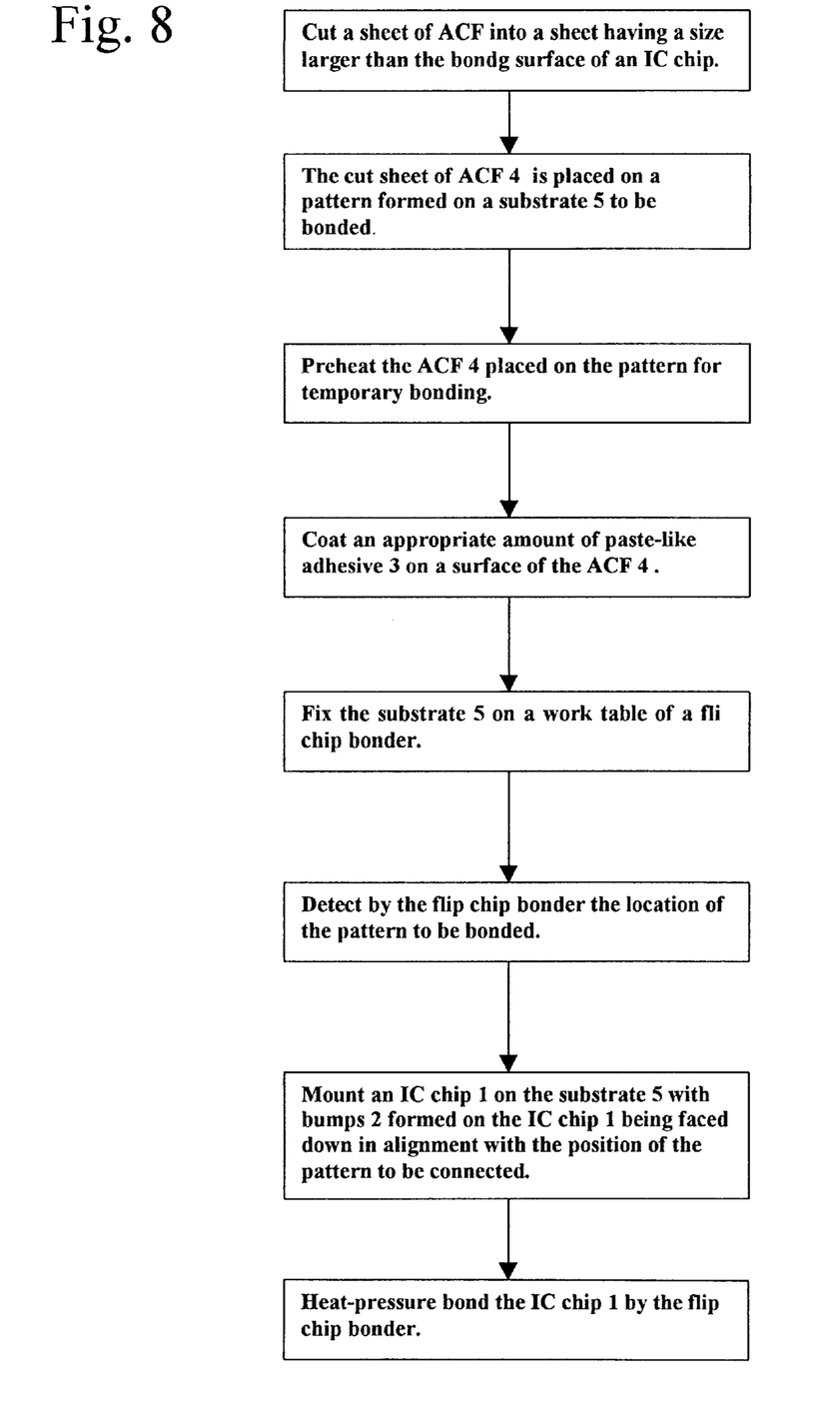
FIG. 8 show a flow diagram of a method for mounting an IC chip on a substrate.

Hereunder, a method of mounting a flip chip in accordance with an embodiment of the present invention will be described with reference to a flow chart shown in FIG. 9.

First, as an initial step, the ACF 4 is temporarily adhered to a location on the substrate 5 where the IC chip 1 is mounted, and the paste-like adhesive 3 is coated on the IC chip 1.

From the viewpoint of efficiency of the mounting work, the ACF 4 is formed from a sheet of anisotropic conductive adhesive that is supplied by manufacturers in the form of a sheet having a uniform thickness. In this case, when the ACF 4 uses a thermosetting type binder, the ACF should be maintained and stored at a low temperature.

The ACF 4 is cut out from a sheet of anisotropic conductive adhesive in a size slightly larger than the bonding surface of the IC chip 1. Then, the cut ACF 4 is placed on the pattern on the substrate 5 to be connected. Then, preheating is conducted to temporarily adhere the ACF 4 to the substrate.

An appropriate amount of the paste-like adhesive 3 is coated on the surface of the IC chip on which the bumps 2 are formed. As a result, the coating amount of the paste-like adhesive 3 can be adjusted based on the bumps 2, and it is easy to determine an appropriate amount of the paste-like adhesive 3 that is required for coating. It is noted that the paste-like adhesive 3 is required to have a viscosity that does not cause dripping of the paste-like adhesive 3 during a process of mounting the IC chip 1 on the substrate 5 in which a surface of the IC chip 1 having the bumps 2 formed thereon faces down. Upon completion of mounting the IC chip 1 on the substrate 5, a preparation process before a heat bonding process is completed.

In a next step, heat bonding of the IC chip is conducted. The substrate 5 with the ACF 4 being temporarily adhered thereto is fixed on a work table of the flip chip bonder. Then, the flip chip bonder detects the position of the pattern on the substrate 5 to be connected. When the position of the pattern is detected, while the surface of the IC chip 1 having the bumps 2 formed thereon is turned down, in other words, is faced in a direction in which the bumps of the IC chip 1 are brought into contact with the ACF 4, the IC chip 1 having the ACP coated thereon is mounted on the substrate 5 in alignment with the detected position, and the IC chip 1 and the substrate 5 are heat bonded together by the flip chip bonder.

It is noted that the filet 31 is effective in protecting the IC chip 1 from environmental factors, in particular, humidity for stable operation of the IC chip 1. In order to positively form the filet 31, the total thickness of the paste-like adhesive 3 and the ACF 4 before the heat bonding is preferably greater than the height of the bumps 2. As a result, the paste-like adhesive 3 is squeezed out onto the peripheral edge portion of the IC chip 1 at the time of the heat-pressure bonding, and the filet 31 of a sufficient size can be formed.

Furthermore, in order to positively form the filet 31 as described above, the ACF 4 preferably has a surface area that is slightly larger than the area of the surface of the IC chip 1 on which the bumps 2 are formed. As shown in FIG. 1, when the surface area of the ACF 4 is greater than the surface area of the IC chip 1 on which the bumps 2 are formed, the ACF 4 protrudes from the peripheral edge portion of the IC chip 1, and the filet 32 having a relatively large size can be formed on the protruded portion of the ACF 4.

However, if the paste-like adhesive 3 that is squeezed out from the peripheral edge of the IC chip reaches a height equivalent to the height of the IC chip 1, the paste-like adhesive 3 may adhere to a plunger jig of the flip chip bonder that presses the IC chip 1. Accordingly, the total thickness of the paste-like adhesive 3 and the ACF 4 and the surface area of the ACF 4 need to be adjusted so that the height of the filet 31 is lower than a surface of the IC chip 1 on the opposite side of the surface on which the bumps 2 are mounted and higher than the surface of the IC chip 1 on which the bumps 2 are mounted.

Preferably, the paste-like adhesive 3 is made from anisotropic conductive paste (ACP).

ACP is a mixture of paste-like adhesive and conductive particles, and has a fluidity that is the same as that of the paste-like adhesive. Furthermore, ACP is anisotropic conductive paste, and therefore when a conduction pressure force is applied, it presents the conductivity in a direction in which the pressure force is applied.

Therefore, when ACP is used, conductive particles contained in the ACP together with conductive particles contained in the ACF 4 provide conductivity. Therefore, the reliability of electrical connection is improved.

Also, when ACP is used as the paste-like adhesive 3, the conductive particles contained in the ACP and ACF 4 preferably have generally the same diameter. As shown in FIG. 2, in the mixed region 8 of the ACF and the paste-like adhesive, the conductive particles contained in the ACP of the paste-like adhesive 3 and the ACF 4 are placed between the bumps 2 and the substrate 5, and therefore, the mixed region 8 is an important region responsible for the electrical connection. If the ACF 4 in the mixed region 8 does not have sufficient amount of conductive particles, it is expected that such insufficiency of the conductive particles is supplemented by the conductive particles contained in the ACP. However, if the conductive particles contained in the ACP are smaller than the conductive particles contained in the ACF 4, they do not contact both of the bumps 2 and the substrate 5, and the effect of increasing the conductivity between the bumps 2 and the substrate 5 is not provided.

Therefore, the conductive particles contained in the ACP and ACF 4 preferably have generally the same diameter so that the conductivity is increased by the working of both of the conductive particles contained therein.

The diameter of the conductive particles is preferably in a range of about 2~10 $\mu$m, in consideration of secure electrical connection between the IC chip 1 and the substrate 5, the thickness of the ACF 4 and a pitch of the bumps.

Figure 6:
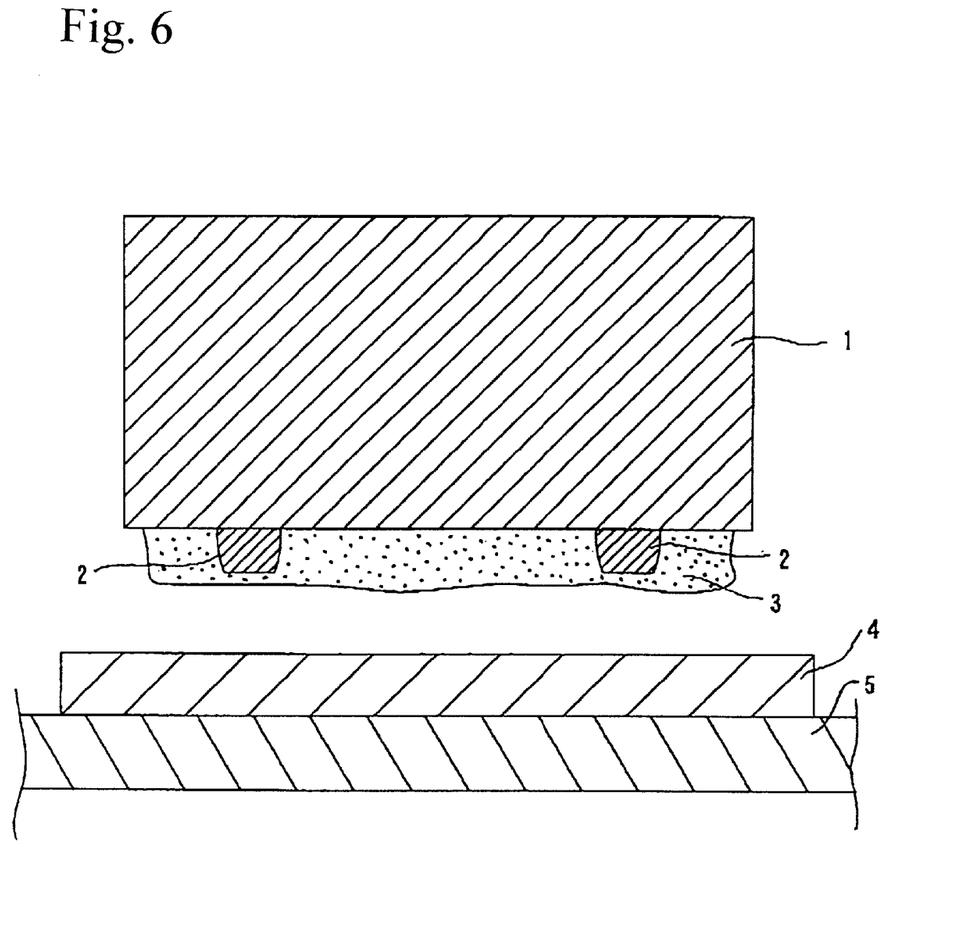
FIG. 6 schematically shows a cross-sectional view of a semiconductor apparatus illustrating a state in which paste-like adhesive is coated on an IC chip in accordance with another embodiment of the present invention.

In accordance with another embodiment of the present invention, the ACF 4 is temporarily adhered to the top surface of the substrate 5, the paste-like adhesive 3 is then coated on the ACF 4, the IC chip 1 is placed on the paste-like adhesive 3, and then the heat bonding is conducted.

Figure 7:
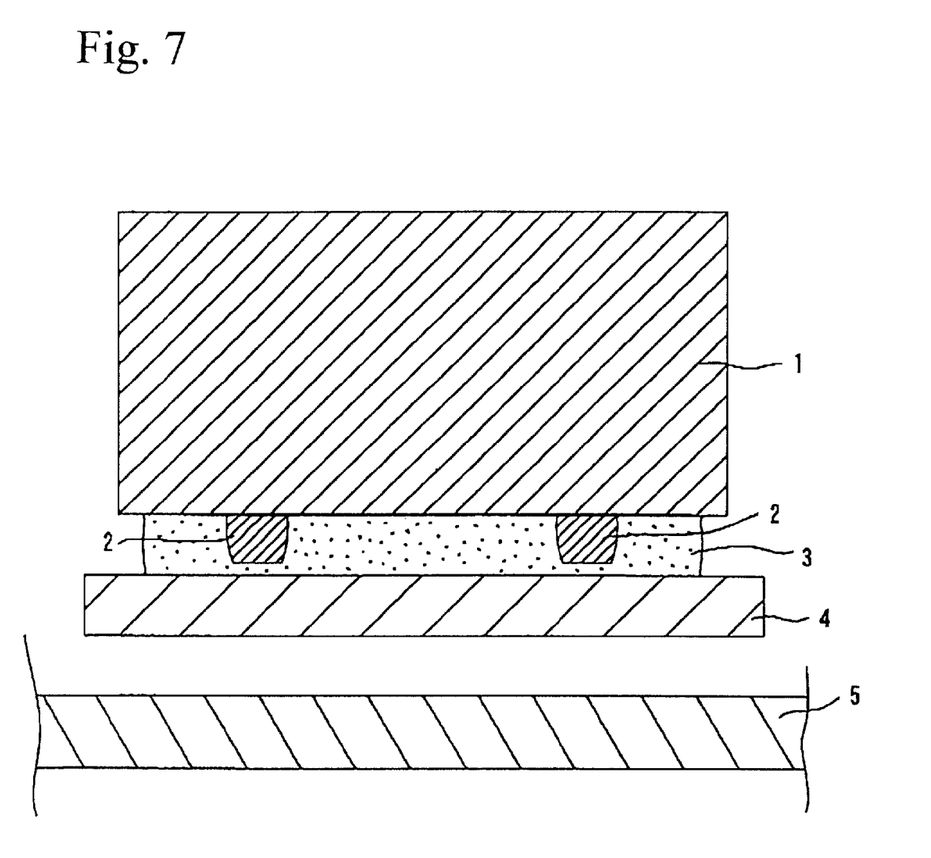
FIG. 7 schematically shows a cross-sectional view of a semiconductor apparatus illustrating a state in which an ACF is adhered to paste-like adhesive in accordance with another embodiment of the present invention.

In accordance with a further embodiment, as shown in FIG. 7, the paste-like adhesive 3 is coated on the surface of the IC chip 1 on which the bumps 2 are formed, the ACF 4 is adhered to the paste-like adhesive 3, the IC chip 1 in this state is placed on the substrate 5, and then the heat bonding is conducted.

In this case, the paste-like adhesive 3 is required to have a viscosity so that the ACF 4 does not fall from the IC chip 1 while a surface of the IC chip 1 having the bumps 2 formed thereon is faced down for mounting the IC chip 1 on the substrate 5.

Further, in accordance with another embodiment of the present invention, passive devices may be mounted on the substrate 5 together with the IC chip 1 by using the paste-like adhesive 3 and the ACF 4, instead of mounting them by a typical solder mounting method. In accordance with this method, defects such as short circuit accompanying the solder mounting method can be avoided. Also, mounting steps for the IC chip and the passive devices are completed in a single step. Furthermore, a washing step to remove remained flux becomes unnecessary, and therefore the cost for mounting process is lowered.

In the above-described embodiments, a combination of the ACF 4 and the paste-like adhesive 3 is used. However, an adhesive which does not contain conductive particles may be used instead of the paste-like adhesive. Accordingly, the reliability of electrical connection provided by the adhesive is lower than that provided by the paste-Like adhesive 3, but the cost is lowered.

In accordance with the above-described embodiments, the paste-like adhesive 3 is coated on the surface of the ACF 4 on the side of the IC chip 1. The paste-like adhesive 3 enters gaps between the bumps 2 and the ACF 4 because the paste-like adhesive 3 is in the form of paste and has a high fluidity, and therefore does not likely generate air bubbles. Even when the ACF 4 cannot conform itself to a change in the surface configuration adjacent to the bumps 2 and bubbles may remain on the bonding surface of the IC chip 1, the bubbles are expelled from the bonding surface by a pressure force applied by the flip chip bonder and do not remain on the bonding surface because the paste-like adhesive 3 has a high degree of fluidity.

Also, a pressure force is applied to provide electrical and mechanical bonding between the IC chip 1 and the substrate 5. As a result, the paste-like adhesive 3 that is squeezed out of the gap between the IC chip 1 and the ACF 4 forms a filet that surrounds the peripheral edge portion of the IC chip, and functions as a mold material. As a result, foreign matters and water are prevented from entering the surface of the IC chip on which the bumps are formed, and the strength of mechanical connection is enhanced.

As described above, in accordance with the embodiments of the present invention, in a flip chip mounting method for mounting an IC chip having electrodes formed on one surface thereof on a substrate with the one surface of the IC chip being directed toward the substrate, the IC chip and the substrate are bonded together in a state in which a sheet of anisotropic conductive adhesive and paste-like adhesive are placed between the IC chip and the substrate. As a result, the electrical and mechanical bonding is enchased and the reliability of mounting flip chips is improved.

Also, the paste-like adhesive forms a filet on a base defined by the sheet of anisotropic conductive adhesive extending around the peripheral side portion of the IC chip, external foreign matters and water are prevented from entering the bonding surfaces between the IC chip and the substrate, and the mechanical strength of the semiconductor apparatus is enhanced. As a result, the life of products using IC chips that are mounted by the mounting method of the present invention is extended. Also, in accordance with the embodiments described above, conductive particles contained in the sheet of anisotropic conductive adhesive and the paste-like adhesive have generally the same diameter. As a result, the reliability of electrical connection is improved. Furthermore, passive devices to be mounted together with an IC chip can be mounted on a substrate by the same method described herein, the productivity of manufacturing products using such IC chips is improved.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. In a flip chip mounting method for mounting an IC chip on a substrate, the IC chip defining one surface and having electrodes formed on the one surface, and the IC chip being positioned so that the electrodes oppose the substrate, the method comprising:

bonding the IC chip and the substrate to one another with a sheet of anisotropic conductive adhesive and paste-like adhesive being placed between the IC chip and the substrate, wherein the paste-like adhesive is anisotropic conductive adhesive.

2. A flip chip mounting method according to claim 1, wherein the IC chip and the substrate are bonded to one another by heat-pressure bonding.

3. A flip chip mounting method according to claim 1, wherein the sheet of anisotropic conductive adhesive is disposed on the side of the substrate and the paste-like adhesive is disposed on the side of the IC chip.

4. A flip chip mounting method according to claim 1, wherein the sheet of anisotropic conductive adhesive is adhered to the substrate before the heat pressure bonding of the IC chip.

5. A flip chip mounting method according to claim 4, wherein the paste-like adhesive is coated on the sheet of anisotropic conductive adhesive adhered to the substrate before the heat pressure bonding of the IC chip.

6. A flip chip mounting method according to claim 1, wherein the paste-like adhesive is coated on the one surface before the heat pressure bonding.

7. A flip chip mounting method according to claim 1, wherein the sheet of anisotropic conductive adhesive is adhered to the paste-like adhesive coated on the one surface before the heat pressure bonding.

8. A flip chip mounting method according to claim 6, wherein the paste-like adhesive has a viscosity so that the paste-like adhesive does not drip from the one surface when the one surface coated with the paste-like adhesive is faced down.

9. A flip chip mounting method according to claim 1, wherein before the heat pressure bonding process, the sum of thickness of the sheet of anisotropic conductive adhesive and the paste-like adhesive is greater than the height of a bump formed on either the IC chip or the substrate.

10. A flip chip mounting method according to claim 8, wherein the sum of thickness of the sheet of anisotropic conductive adhesive and the paste-like adhesive is set in a range in which the height of a filet formed with the sheet of anisotropic conductive adhesive and the paste-like adhesive during the heat pressure bonding process is greater than a level of the one surface of the IC chip and smaller than another surface of the IC chip on the opposite side of the one surface.

11. A flip chip mounting method according to claim 1, wherein the sheet of anisotropic conductive adhesive has an area greater than that of the one surface.

12. A flip chip mounting method according to claim 11, wherein the sheet of anisotropic conductive adhesive has an area that is set in a range in which the height of a filet formed with the sheet of anisotropic conductive adhesive and the paste-like adhesive after the heat pressure bonding process is greater than a level of the one surface of the IC chip and smaller than another surface of the IC chip on the opposite side of the one surface.

13. A flip chip mounting method according to claim 1, wherein conductive particles contained in the sheet of anisotropic conductive adhesive and conductive particles contained in the paste-like adhesive have generally the same diameter.

14. A flip chip mounting method according to claim 1, wherein the sheet of anisotropic conductive adhesive and the paste-like adhesive are used for connecting passive devices mounted on the IC chip to the substrate.

15. A semiconductor apparatus manufactured by a flip chip mounting method according to claim 1.

16. A semiconductor apparatus comprising:

a substrate;

an IC chip defining one surface and having an electrode formed on the one surface, the one surface of the IC chip opposing the substrate; and a sheet of anisotropic conductive adhesive and paste-like adhesive being placed between the IC chip and the substrate, wherein the paste-like adhesive is anisotropic conductive adhesive.

17. A semiconductor apparatus according to claim 16, wherein the IC chip is heat bonded to the substrate with the sheet of anisotropic conductive adhesive and the paste-like adhesive being placed being placed between the IC chip and the substrate.

18. A semiconductor apparatus according to claim 16, wherein the sheet of anisotropic conductive adhesive is disposed on the substrate and the paste-like adhesive is disposed on the IC chip.

19. A semiconductor apparatus according to claim 16, wherein the sheet of anisotropic conductive adhesive has an area greater than that of the one surface of the IC chip.

20. A semiconductor apparatus according to claim 19, wherein the sheet of anisotropic conductive adhesive has a protruded section protruding from a peripheral edge of the IC chip, and the protruded portion of the sheet of anisotropic conductive adhesive and the paste-like adhesive form a filet around the peripheral edge of the IC chip, the filet having a height greater than a level of the one surface of the IC chip and smaller than another surface of the IC chip on the opposite side of the one surface.

21. A semiconductor apparatus according to claim 16, wherein conductive particles contained in the sheet of anisotropic conductive adhesive and conductive particles contained in the paste-like adhesive have generally the same diameter.

22. A flip chip mounting method according to claim 1, wherein the IC chip comprises passive devices connected to the substrate by the sheet of anisotropic conductive adhesive and the paste-like adhesive.

* * * * *